(12) United States Patent
Tsugai et al.

(10) Patent No.: US 6,259,548 B1
(45) Date of Patent: Jul. 10, 2001

(54) MICRO-MIRROR DEVICE

(75) Inventors: Masahiro Tsugai; Nobuaki Konno; Hiroyuki Fujita; Makoto Mita; Hiroshi Toshiyoshi; Yoshio Mita, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/401,947

(22) Filed: Sep. 23, 1999

(30) Foreign Application Priority Data

May 28, 1999 (JP) .................................................. 11-150590

(51) Int. Cl.⁷ .................................................. G02B 26/08
(52) U.S. Cl. .......................... 359/224; 359/225; 359/872
(58) Field of Search .................................... 359/196, 224, 359/225, 872

(56) References Cited

U.S. PATENT DOCUMENTS 5,543,956 * 8/1996 Nakagawa et al. .................. 359/225
5,710,657 * 1/1998 Um ........................................ 359/224
5,969,465 * 10/1999 Neukermans et al. ................ 359/224

OTHER PUBLICATIONS

Vangbo et al., "Low Cost Micromachined Mirror For Display Systems", Journal of Micromechnical Microengineering, vol. 9, 1999, pp. 85–88.

Kranert et al., "Laser Display Technology", IEEE 1998, pp. 99–104.

* cited by examiner

Primary Examiner—Darren Schuberg
(74) Attorney, Agent, or Firm—Leydig, Voit& Mayer, L

(57) ABSTRACT

A micro-mirror device includes a mirror forming substrate on which a mirror is disposed. A pair of torsion beams are disposed on opposing sides of the mirror forming substrate. An anchor projects from a supporting substrate, supporting the ends of the torsion beams. A driving frame surrounds at least one side of the torsion beams and is connected to the mirror forming substrate through a link beam. A drive force generator drives the driving frame.

16 Claims, 9 Drawing Sheets

$g_1 > g_2$

MICRO-MIRROR DEVICE

BACKGROUND OF THE INVENTION

1. Field of the Invention

The present invention relates to a micro-mirror device, which can be used as a scanning mirror to be incorporated, for example, in a light scanning type sensor for form recognition, a bar code reader, or a laser printer, and to a method for producing such a micro-mirror device.

2. Description of the Prior Art

FIG. 17 is a schematic plan view of the micro-mirror device in the prior art. FIG. 18 is a cross sectional view of the micro-mirror device in FIG. 18, along the line 18—of FIG. 7. A mirror portion 101 is disposed on a surface of a mirror forming substrate 102. The mirror portion is formed by a thin aluminum layer or a thin gold layer. The mirror forming substrate 102 can rotate around its center axis. A torsion beam 103 extends along the center axis of the mirror forming substrate 102. The torsion beam 103 is supported by a pair of anchors 104, which are fixed to a base substrate 106. A pair of driving electrodes 105 are disposed on the base substrate 106.

There are gaps of distance g0 between the driving electrodes 105 and the mirror forming substrate 102. A voltage is applied to either of the driving electrodes 105, so that the mirror forming substrate 102 is driven to rotate by the electrostatic force. The mirror forming substrate 102, torsion beam 103 and the anchors 104 are made from, for example, single crystal silicon, poly-crystalline silicon, or nickel plating. The base substrate 106 is made from, for example, silicon or glass.

The function of the micro-mirror device in the prior art is explained below.

When a voltage is applied to either of the driving electrodes 105, an attracting force is generated between the mirror forming substrate 102 and the driving electrode 105, depending on the voltage and the electrostatic capacity between them. The mirror forming substrate 102 rotates around its center portion, until the mirror portion 101 inclines at an angle $\theta s$ (scanning angle). The mirror portion 101 can be driven to rotate and swing simultaneously, when a voltage, for example, a superposition of a biasing direct voltage Vdc and alternating voltages Vac, having phases difference of 180 degree to each other, as shown in FIG. 19, is applied to the driving electrodes 105. The scanning angle of the mirror portion 101 and the scanning angle of a light beam can be controlled, depending on the imposing voltages.

When the micro-mirror device in the prior art is used, the theoretical maximum scanning angle $\theta smax$ of the scanning angle $\theta s$ is given by the following mathematical expression (1):

$$\sin(\theta smax) = g0/L \quad (1)$$

where L is a distance between the center and the side end of the mirror forming substrate 102, as shown in FIG. 18. For example, assuming that L is 1 mm and the required maximum scanning angle $\theta smax$ is 15 degrees, the necessary distance go of the gap is calculated to be 259 $\mu m$, using this mathematical expression (1).

However, the mirror portion 101 in an actual micro-mirror device in the prior art can not be rotated up to the full span, i.e., the theoretical maximum scanning degree. This is because the relation between the distance g0 of the gap and the electrostatic force to rotate the mirror portion 101 is non-linear, when the electrostatic force is used. Specifically, because the magnitude of the electrostatic attractive force is proportional to the inverse square of the distance g0 of the gap, when the inclination angle of the mirror forming substrate 102 is large and the distance go of the gap between the mirror forming substrate 102 and one of the driving electrodes 105 is small, the electrostatic attractive force between the mirror forming substrate 102 and the driving electrode 105 becomes larger than the restoring force due to the torsion of the torsion beam 103 at a large torsion angle. As a result, the mirror forming substrate 102 is fixed to one of the driving electrodes 105 and does not move. This phenomenon is called "Pulled-in Phenomenon". For avoiding this phenomenon, the scanning angle $\theta s$ of a light beam of the mirror portion 101 is restricted to be within a stable region, which is, in general, about a half of the theoretical maximum scanning angle $\theta smax$.

The micro-mirror device in the prior art has the drawback that it is difficult to increase the maximum scanning angle $\theta smax$, due to the Pull-in Phenomenon.

The other drawback of the micro-mirror device in the prior art is that it is difficult to design a micro-mirror device, which can scan at a wide range of scanning angle of a light beam, a low driving voltage is used. Because, assuming that the characteristics of the torsional oscillation, for example, shear modulus or the Q-value of the oscillation are constant, the range of a stable scanning angle and the corresponding driving voltage are determined by the size of the mirror forming substrate 102 with the mirror portion, and the distance g0 of the gap between the mirror forming substrate 102 and the driving electrodes 105, which are disposed under the mirror forming substrate 102.

SUMMARY OF THE INVENTION

An object of the present invention is to eliminate the drawbacks in the micro-mirror device in the prior art.

Another object is to propose a micro-mirror device, which can scan the light beam in an increased scanning angle, using a low driving voltage.

Another object is to propose a method for producing such a micro-mirror device.

The objects are attained by a micro-mirror device according to the present invention, comprising a driving frame which is separated from the mirror forming substrate, and the mirror forming substrate is not driven directly, but is driven indirectly through the driving frame.

More specifically, the object is attained by a micro-mirror device according to the present invention1 comprising: a supporting substrate; a mirror forming substrate, on which a mirror portion is formed, a pair of first torsion beams disposed on a pair of the opposing sides of the mirror forming substrate, which are perpendicular to those sides and support the mirror forming substrate; a first driving frame surrounding at least one side of the mirror forming substrate and connected to the mirror forming substrate through a first link beam, which is disposed in parallel to the longitudinal direction of the first torsion beams; and a first driving force generating means for driving the first driving frame to move so that the movement is transmitted to the mirror forming substrate through the first link beam.

In an embodiment of the present invention, the ends of the first torsion beams are supported by a pair of first anchor portions projecting from the supporting substrate.

In an embodiment of the present invention, the ends of the first torsion beam are supported by the first driving frame.

In an embodiment of the present invention, further comprising: a second driving frame; a second driving force generating means for driving the second driving frame to move; wherein the ends of the first torsion beams are supported by the first driving frame; the first driving frame has third torsion beams, disposed on one side of the first driving frame opposing to the first link beam, perpendicular to the first torsion beam; the ends of the third torsion beams are supported by a pair of third anchor portions projecting from the supporting substrate; the second driving frame is connected to the first driving frame through a second link beam, which is disposed at one side of the second driving frame in parallel to the longitudinal direction of the third torsion beams.

In an embodiment of the present invention, the first driving frame has a pair of second torsion beams disposed on a pair of the opposing sides of the first driving frame, the second torsion beam are parallel to the first torsion beam; and the ends of the second torsion beam are supported by a pair of second anchor portions projecting from the supporting substrate.

In an embodiment of the present invention, one side of the first driving frame is supported by an anchor portion projecting from the supporting substrate.

In an embodiment of the present invention, the one side of the second driving frame is supported by a third anchor portion projecting from the supporting substrate.

In an embodiment of the present invention, the first link beams is connected to the mirror forming substrate at a position very near to the base portion of the first torsion beam.

In an embodiment of the present invention, the second link beams is connected to the first driving frame at a position very near to the base portion of the third torsion beam.

In an embodiment of the present invention, the mirror forming substrate has a planer structure, which is asymmetric with respect to the first torsion beams.

In an embodiment of the present invention, the first driving force generating means comprises a driving electrode disposed on the supporting substrate at a region under the first driving frame, and a driving voltage is applied either of the first driving frame or the driving electrode so that the driving frame is driven by an attracting electrostatic force between them.

In an embodiment of the present invention, the second driving force generating means comprises a driving electrode disposed on the supporting substrate at a region under the second driving frame, and a driving voltage is applied either of the second driving frame or the driving electrode so that the driving frame is driven by an attracting electrostatic force between them.

In an embodiment of the present invention, the first driving force generating means comprises a piezoelectric element disposed on the first driving frame, and an alternating voltage is applied between the upper and lower surface of the piezoelectric element so that a bending oscillation of the piezoelectric element occurs.

In an embodiment of the present invention, the second driving force generating means comprises a piezoelectric element disposed on the second driving frame, and an alternating voltage is applied between the upper and lower surface of the piezoelectric element so that a bending oscillation of the piezoelectric element occurs.

In an embodiment of the present invention, the first driving force generating means comprises a coupling of permanent magnet and an electromagnet and the first driving frame is driven by the magnetic force caused by the coupling of the permanent magnet and the electromagnet.

In an embodiment of the present invention, the second driving force generating means comprises a coupling of permanent magnet and an electromagnet and the second driving frame is driven by the magnetic force caused by the coupling of the permanent magnet and the electromagnet.

In an embodiment of the present invention, a recess is disposed on the supporting substrate at a region under the mirror forming substrate.

In an embodiment of the present invention, the mirror forming substrate is sufficiently thin compared to the thickness of the first driving frame.

Further a method for producing a micro-mirror device according to the present invention is proposed, which comprises: a process for forming a multi-layer of etching masks on the upper and/or under surface of a material substrate, the patterns on each of the etching masks correspond to components of a micro-mirror device; and a process for forming components of a micro-mirror, by alternating anisotropic etching of the material substrate and removing of the etching mask, on which a multi-layer of etching masks are formed,.

In an embodiment of the method for producing a micro-mirror device, the material substrate is made from SOI substrate, and the multi-layer of etching masks are formed on one surface of the SOI substrate; and a process for forming components of a micro-mirror, by alternating anisotropic etching of the material substrate and removing of the etching mask in the multi-layer masks.

DETAILED DESCRIPTION OF THE PREFERRED EMBODIMENT

Embodiments of the micro-mirror device according to the present invention are explained below.

Embodiment 1

Figure 1:
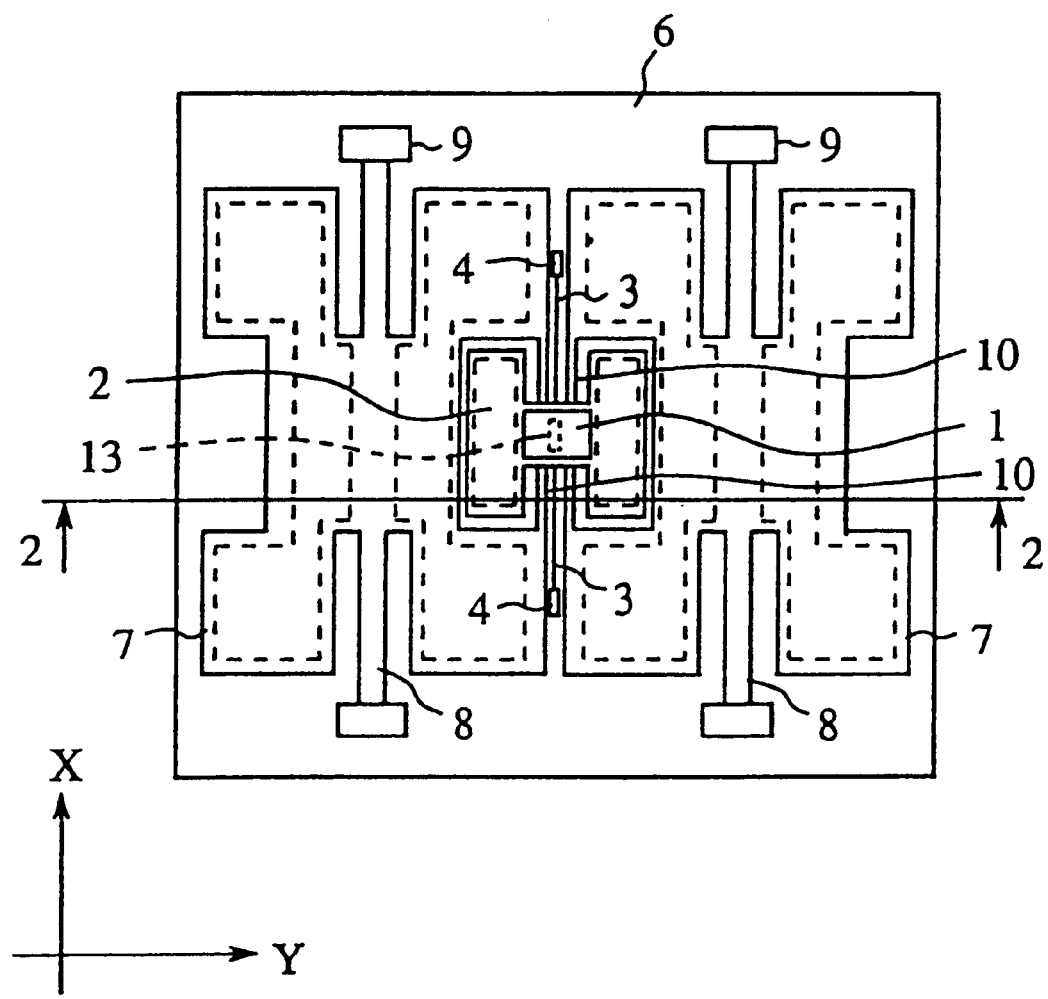
FIG. 1 is a schematic plan view of a micro-mirror device according to Embodiment 1 of the present invention.

Embodiment 1 is explained below, referring to FIGS. 1 and 2. A mirror portion 1, made from thin metal layer, for example, aluminum layer, gold layer, etc, is formed on a mirror forming substrate 2. The mirror forming substrate 2 has a first torsion beam 3, which extends along a line in the direction X in FIG. 1 perpendicular to a pair of opposing sides of the mirror forming substrate 2. Both the ends of the first torsion beam 3 are connected to a pair of first anchors 4. When right and left side portions of mirror forming substrate 2 are displaced in a direction perpendicular to the supporting substrate 6, mainly along the direction Z in FIG. 2, the mirror forming substrate 2 swings around the first torsion beam 3. All the components of the micro-mirror device are supported by a supporting substrate 6, which is made from, for example, pyrex glass.

A pair of first driving frames 7 are connected with the mirror forming substrate 2 through a first link beam 10. Each of the first driving frames 7 has a pair of second torsion beams 8. Both the ends of the second torsion beams 8 are supported by a pair of second anchors 9. Therefore, the first driving frames 7 are supported by the supporting substrate 6 through the second anchors 9. In the example shown in FIGS. 1 and 2, two first driving frames 7 are arranged, at both sides of the mirror forming substrate 2, in the direction Y in FIG. 1. The pair of the second torsion beams 8 of each of the driving frame 7 extends along a line perpendicular to the opposing sides of the first driving frame 7. When both side portions of this first driving frame 7 displace oppositely in a direction perpendicular to the supporting substrate 6 (direction Z in FIG. 2), the driving frames 7 swing around the torsion beam 8. The first link beam 10 is disposed in each of the driving frames 7. The first link beam 10 of each of the first driving frames 7 is disposed in parallel with the first torsion beam 3 of the mirror forming substrate 2, and is connected with the mirror forming substrate 2 at a very near position to the base portion of the first torsion beam 3.

A pair of sensor electrodes 11 are disposed on the supporting substrate 6 at positions under the mirror forming substrate 2. The sensor electrodes 11 monitor the light scanning angle θs of the mirror portion 1, by detecting the electrostatic capacity between the mirror forming substrate 2 and the sensor electrodes 11. A plurality of driving electrodes 12, as a driving force generating means, are disposed on the supporting substrate 6. The driving electrodes 12 generate an electrostatic attractive force depending on the voltage applied to them so as to drive the driving frame 7 to swing. In the example shown in FIG. 2, two driving electrodes are disposed under each of the first driving frames 7, namely, four driving electrodes 12 are disposed in all. A stopper 13 is disposed for inhibiting an excessive displacement of the mirror forming substrate 2 in the Z direction shown in FIG. 2.

The function of the micro-mirror device of this embodiment is explained below.

Figure 19:
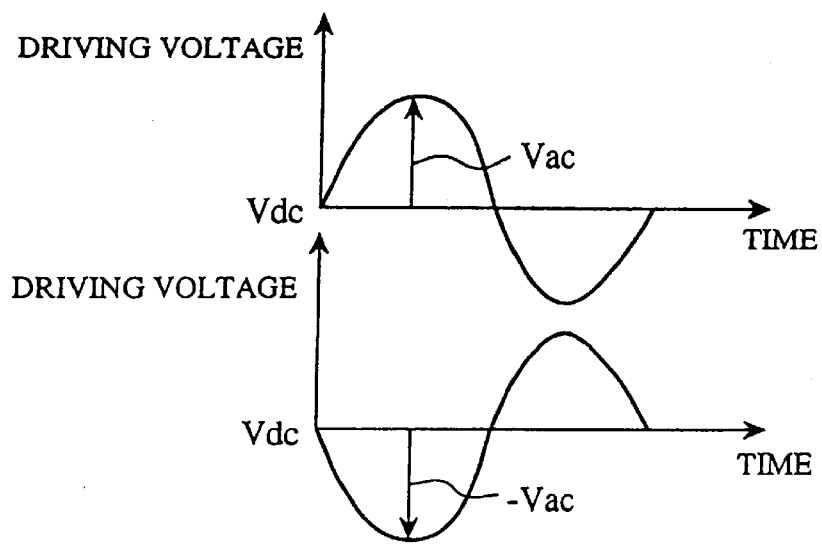
FIG. 19 shows an example of voltages to be applied to the driving electrodes of the micro-mirror device.

A direct voltage Vdc and alternating voltages Vac shown in FIG. 19 are applied to the driving electrodes 12 disposed under the first driving frames 7 at the right and left sides of the mirror forming substrates 2. When the alternating voltages applied to two driving electrodes 12 in each of the first driving frames 7 are in inverse phase, i.e. the phase difference between them is 180 degrees, both sides of the driving frames 7 displace oppositely in the direction Z shown in FIG. 2 so that the first driving frames swing around the second torsion beam 8, due to the electrostatic attractive forces between the driving electrodes 12 and the driving frames 7. Furthermore, when the phase of the alternating voltages Vac to be applied to the driving electrode 12 corresponding to the first driving frame 7 disposed at the right side of the mirror forming substrate 2 is identical to that of the first driving frame 7 disposed at the left side of the mirror forming substrate 2, the right and left first driving frames 7 swing identically to each other. The driving force due to the torsional oscillation of the first driving frames 7 are transmitted indirectly to the mirror forming substrate 2 through the first link beam 10 so that the mirror forming substrate 2 swings, namely, a torsional oscillation of the mirror forming substrate 2 occurs.

The first link beams 10 are connected to the mirror forming substrate 2 at a position very near to the base portion of the first torsion beam 3, and the connecting point between the second link beams 10 and the mirror forming substrate 3 is sufficiently far from the second torsion beam 8 of the first driving frames 7. Therefore, even when the displacements of the link beams 10 in the direction Z shown in FIG. 2, are small, the magnitude of the swing of the mirror forming substrate 2 around the first torsion beam 3 can be amplified. In other words, giving a small torsion to the first driving frames 7, a large torsion of the mirror forming substrate 2 can be obtained. As a result, it is possible to obtain a micro-mirror device, in which a large maximum scanning angle θsmax of the mirror portion 1 can be obtained, using a low driving voltage.

Another example of Embodiment 1 is explained below, referring to FIG. 3.

A pair of grooves 15 are disposed on the supporting substrate 6 under the mirror forming substrate 2. The grooves function as recesses for avoiding the collision of the mirror forming substrate 2 to the supporting substrate 6. Components in FIG. 3 identical to that in FIG. 1 are referred by same reference numerals, and their explanations are omitted.

In the aforementioned micro-mirror devices, the first driving frames 7 are driven by the electrostatic attractive forces between the first driving frames 7 and the driving electrodes 12. Therefore, the necessary driving voltage to be applied to the driving electrodes 7 can be decreased, by reducing the distance between the first driving frame 7 and the driving electrodes 12.

Figure 2:
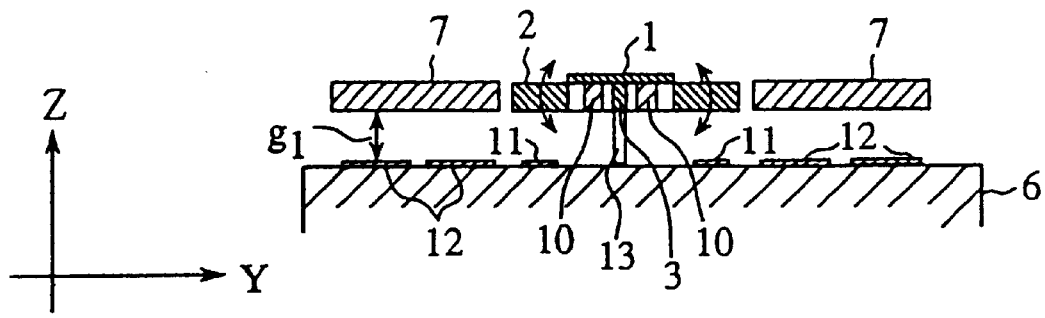
FIG. 2 is a cross sectional view of the micro-mirror device of FIG. 1, shown along the line 2—2.
Figure 3:
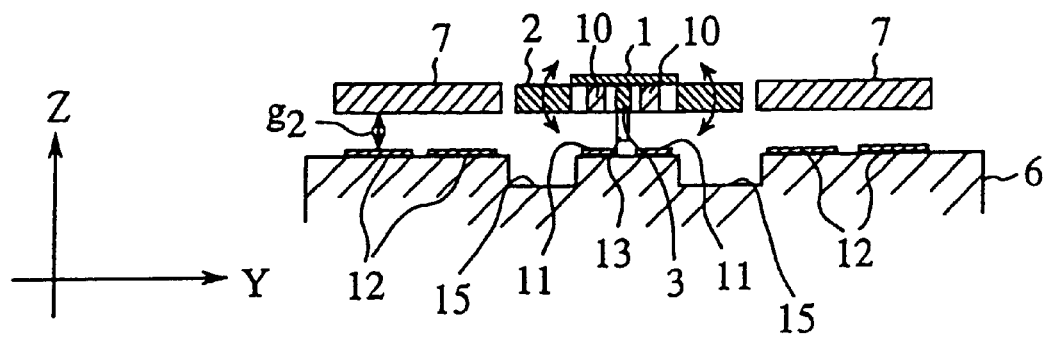
FIG. 3 is a cross sectional view of another example the micro-mirror device according to Embodiment 1, shown along the same line 3—3 in FIG. 1.

The distance g2 of the gap between the first driving frame 7 and the driving electrodes 12 shown in FIG. 3 is smaller than the distance g1 of the gap shown in FIG. 2, i.e., g1<g2. In the example shown in FIG. 3, a groove 15 is disposed on the supporting substrate 6, therefore, the side ends of the mirror forming substrate 2 do not contact with the supporting substrate 6, when the mirror forming substrate 2 swing around the torsion beam 3. Furthermore, a sensor electrodes 11 for detecting the scanning angle θs are disposed on the supporting substrate 2 at a region under the mirror forming substrate 2 near to the base portion of the torsion beam 3, where the displacement in the direction Z is small. The motion of the mirror forming substrate 2 can be stabilized by these structure, namely the "pulled in phenomenon" does not occur, even when the distance between the first driving frames 7 and the driving electrodes 12 is designed to be small. Consequently, it is possible to reduce the necessary driving voltage.

As explained, in this embodiment, the micro-mirror device comprises: a supporting substrate 6; a mirror forming substrate 2, on which a mirror portion 1 is formed, a pair of first torsion beams 3 disposed on a pair of the opposing sides of the mirror forming substrate 2, which are perpendicular to those sides and support the mirror forming substrate 2; a first driving frame 7 surrounding at least one side of the mirror forming substrate 2 and connected to the mirror forming substrate 2 through a first link beam 10, which is disposed in parallel to the longitudinal direction of the first torsion beams 3; and a first driving force generating means 12 for driving the first driving frame 7 to move so that the movement is transmitted to the mirror forming substrate 2 through the first link beam 10.

Thus, a large displacement of the mirror forming substrate 2 in the direction A in FIG. 2 and a large scanning angle θs can be obtained, corresponding to a small displacement of the first driving frame 7. As a result, the necessary voltage for driving the mirror forming substrate can be lowered.

When grooves 15, which serves as a recess for avoiding the collision of mirror forming substrate 2 to the supporting substrate 6, are disposed on the supporting substrate 6 under the mirror forming substrate 2, the motion of the mirror forming substrate 2 can be stabilized, even when the distance of the gap between the first driving frames 7 and the driving electrodes 12 is small. Consequently, the driving voltage can be lowered.

In the Example 1, two first driving frames 7 are disposed at the right and left sides of the mirror forming substrate 2. However, it is possible to generate an oscillation of the mirror forming substrate 2, by disposing only one first driving frame 7 at one side of the mirror forming substrate 2.

In the Example 1, the first link beams 10 are connected with the mirror forming substrate 2 at a region near to the first torsion beam 3. However the connecting points are not limited to this region. That is to say, even when the first link beams 10 can be connected to the mirror forming substrate 2 at a region not very near to the first torsion beam 3. Because a large swing of the mirror forming substrate 2 around its axis can be obtained by a small swing of the first driving frame 7 around the second torsion beam 8, when the size of the first driving frames 7 are made larger compared to that of the mirror forming substrate 2 so that the distance between the second torsion beam 8 and the connecting points between the first link beam 10 and the mirror forming substrate 2 is made larger.

Embodiment 2

Also in the micro-mirror device according to the embodiment 2, a driving force is transmitted from first driving frames to the mirror forming substrate through first link beams, in the same manner as in the embodiment 1. However, in the embodiment 2, the first driving frames disposed at both sides of the mirror forming substrate are cantilevered, and the mirror forming substrate is driven to swing around its axis by the cantilever oscillation of the first driving frames.

Figure 4:
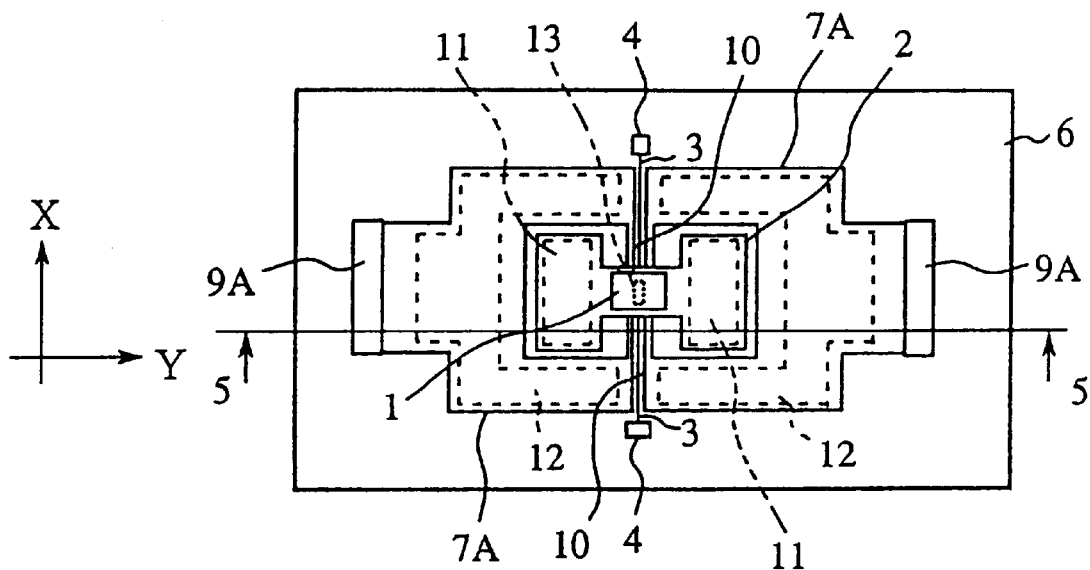
FIG. 4 is a schematic plan view of a micro-mirror device according to Embodiment 2 of the present invention.
Figure 5:
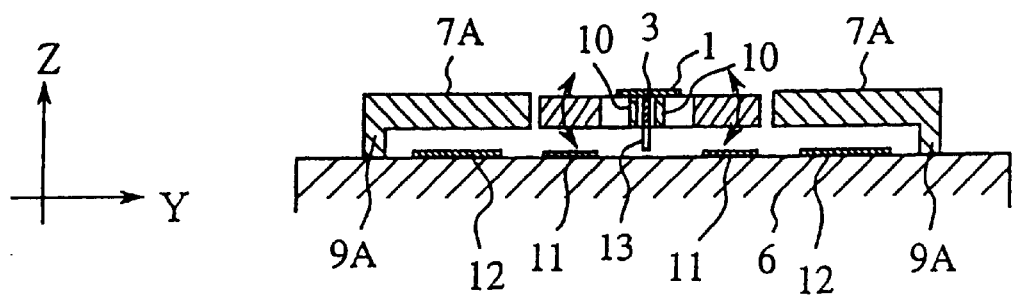
FIG. 5 is a cross sectional view of the micro-mirror device of FIG. 4, shown along the line 5—5.

The micro-mirror device according to the embodiment 2 is explained below, referring to FIGS. 4 and 5.

A pair of first driving frames 7A are supported by a pair of anchor portions 9A (second driving frame side anchor portion), which are, in turn, supported by a supporting substrate 6. The anchor portions 9A are connected to a side of the first driving frames 7A. The first driving frames 7A have a cantilever structure supported by the anchor portions 9A and are fixed on the supporting substrate 6, as shown in FIG. 5. A pair of driving electrodes 12 (driving force generating means) for driving the first driving frames 7A are disposed on the supporting substrate 6 at the right and left side of the mirror forming substrate 2. The other components in the micro-mirror device according the embodiment 2 identical to that in FIGS. 1 and 2 are referred by the same reference numerals, and their explanations are omitted.

The function of the micro-mirror device according to the embodiment 2 is explained below.

A biasing direct voltage Vdc is applied commonly between the first driving frames 7A and the driving electrodes 12 disposed on the supporting substrate 6 under the driving frames 7A. And an alternating voltages Vac are superposed to the direct voltage. The phase of the alternating voltages Vac applied to the driving electrodes 12 corresponding to the first driving frames 7A disposed at right and left sides of the mirror forming substrate 2 are inverse to each other. An attracting electrostatic force is generated between the driving frames 7A and the driving electrodes 12. As a result, the first driving frames 7A swing around its base portion, in the direction Z in FIG. 5, i.e. a cantilever oscillation of the driving frames 7A occurs.

The driving force caused by the cantilever oscillation of the first driving frame 7A is transmitted indirectly to the mirror forming substrate 2 so that both sides of the mirror forming substrate 2 move in the direction Z perpendicular to the supporting substrate 6. When the two sides of the mirror forming substrate move in the opposite direction, the mirror forming substrate 2 swings around the first torsion beam 3, namely a torsional oscillation of the mirror forming substrate 2 occurs. As a result, a micro-mirror device operable, which can scan the light beam in a wide maximum scanning angle θsmax, using a low driving voltage, can be obtained.

Figure 6:
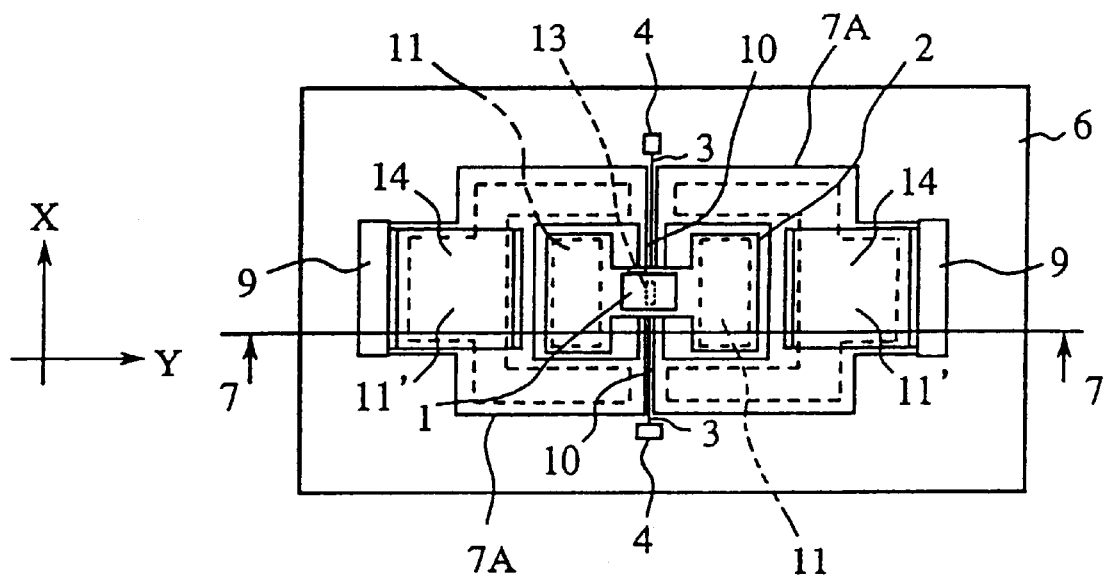
FIG. 6 is a schematic plan view of a micro-mirror device, using another driving force generating means, according to Embodiment 2 of the present invention.

Another example of the micro-mirror device according to the embodiment 2 is explained below, referring to FIGS. 6 and 7.

In this example, a pair of sensor electrodes 11' are disposed on the supporting substrate 6 at a region just under the first driving frame 7. The sensor electrodes monitor the scanning angle of the mirror forming substrate 2, on the basis of the displacement of the first driving frame 7A. The electrostatic capacity between mirror forming substrate 2 and the sensor electrodes 11 disposed just under the mirror forming substrate 2 is proportional to the inverse of the distance between the mirror forming substrate 2 and the sensor electrodes 11'. However, this relation does not stand, when the scanning angle of the mirror forming substrate in the torsional movement of the mirror forming substrate 2 becomes large. The sensor electrodes are disposed at a region just under the first driving frames 7A, for avoiding this problem.

A piezoelectric element 14 as a driving force generating means are disposed on the first driving frame 7A. The piezoelectric elements 14 are made from, for example, conventional bulk piezoelectric element or thin layer piezoelectric element. Components in FIGS. 6 and 7 identical to that in FIGS. 4, and 5 are referred by the same reference numerals, and their explanations are omitted.

The function of this example of the micro-mirror device according to the embodiment 2 is explained below.

Figure 7:
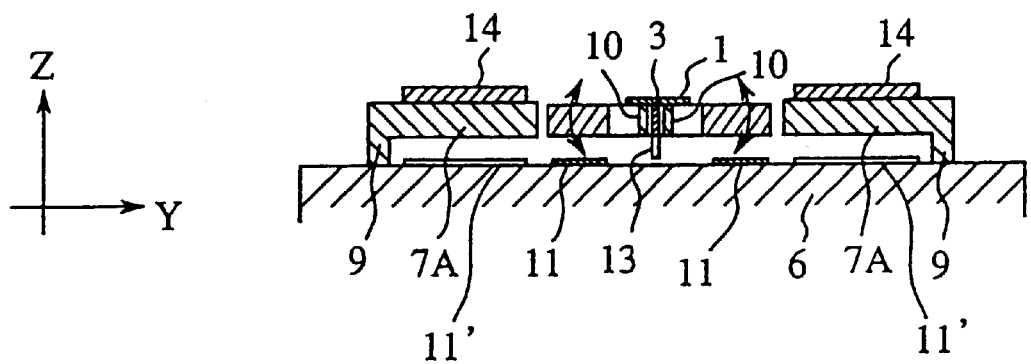
FIG. 7 is a cross sectional view of the micro-mirror device of FIG. 6, shown along the line 7—7.

When an alternating voltage is applied between the over surface and the under surface of the piezoelectric elements 14 disposed on the first driving frames 7A, namely the voltage is applied in the direction Z in FIG. 7, the over surface and the under surface of the piezoelectric elements 14 alternatively elongates and shrinks. When the over surface elongates, the under surface shrinks, and vice versa. As a result, bending oscillations of the piezoelectric elements 14 in the direction Z in FIG. 7 occur. The driving forces caused by these bending oscillations are transmitted directly to the first driving frame 7A to induce cantilever oscillations of the first driving frames 7A. The driving force due to the cantilever oscillation of the first driving frame 7A are transmitted indirectly to the mirror forming substrate 2 through the first link beam 10. A torsional oscillation of the mirror forming substrate 2 around the torsion beam 3 occurs, when two sides of the mirror forming substrate 2 move oppositely in the direction Z in FIG. 7.

Figure 8:
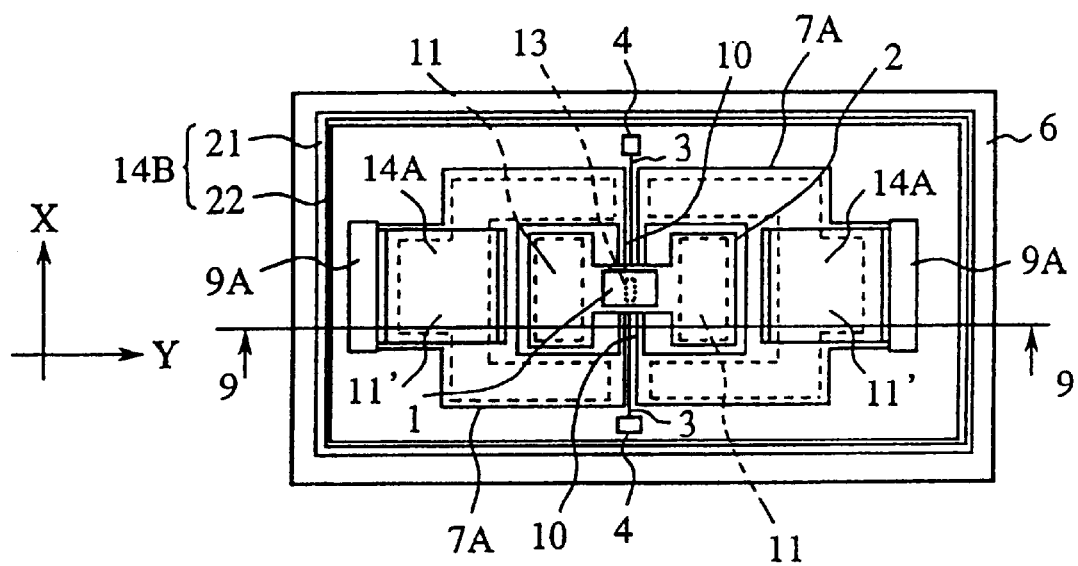
FIG. 8 is a schematic plan view of a micro-mirror device, according to Embodiment 2 of the present invention, using further another driving force generating means.

Further another example of the micro-mirror device according to the embodiment 2 is explained below, referring to FIGS. 8 and 9.

Also in this example, a pair of sensor electrodes 11' are disposed on the supporting substrate 6 at a region just under the first driving frame 7. The sensor electrodes monitor the scanning angle of the mirror forming substrate 2, on the basis of the displacement of the first driving frame 7A. The electrostatic capacity between mirror forming substrate 2 and the sensor electrodes 11 disposed just under the mirror forming substrate 2 is proportional to the inverse of the distance between the mirror forming substrate 2 and the sensor electrodes 11'. However this relation does not stand, when the scanning angle of the mirror forming substrate is large. The sensor electrodes are disposed at a region just under the first driving frames 7A, for eliminating this influence.

Permanent magnets 14A are disposed on the first driving frame 7A as a driving force generating means. The permanent magnets 14A are made from conventional bulk magnetic element or thin layer magnetic element. In the example shown in the figure, the magnetic polarities of the magnets 14A are configured oppositely in the direction Z in FIG. 9. A solenoid coil 21 supported by a coil supporting core 22 is disposed so as to surround the micro-mirror device. The solenoid coil 21 and the coil supporting core 22 form an electromagnet 14B as a driving force generating means. Components in FIGS. 8 and 9 identical to that in FIGS. 4 and 6 are referred by the same reference numerals, and their explanations are omitted.

The function of this example of the micro-mirror device according to the embodiment 2 is explained below.

Figure 9:
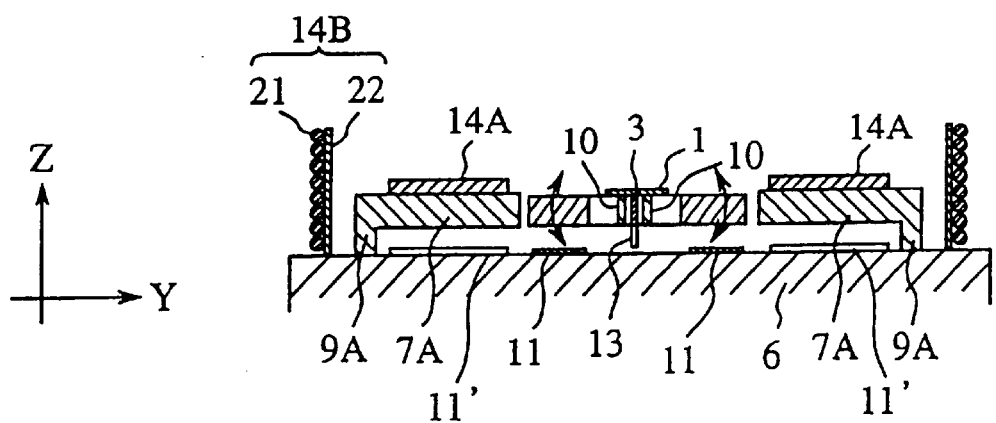
FIG. 9 is a cross sectional view of the micro-mirror device of FIG. 8, shown along the line 9—9.

When an alternating current flows through the electromagnet 14B surrounding the micro-mirror device, a magnetic forces in the direction Z in FIG. 9 acts to each of the electromagnets 14B. And, a cantilever oscillation of the driving frames 7A appears due to this magnetic force. Because the magnetic polarities of the permanent magnets 14A are opposite to each other, the magnetic forces acting the permanent magnets 14A are opposite to each other. Therefore, the directions of the cantilever oscillation of the first driving frames 7A are opposite to each other. The driving forces caused by the cantilever oscillation of the first driving frames 7A are transmitted indirectly to the mirror forming substrate 2 through the first link beam 10. As a result, the mirror forming substrates 2 swings in the direction Z in FIG. 9, namely, a torsional oscillation of the mirror forming substrate 2 around the first torsion beam 3 appears. Other functions of this example are identical to the other examples of the micro-mirror device according to the embodiment 2. Thus, their explanations are omitted.

In the aforementioned example, the permanent magnets 14A are disposed on the driving frame side, and the electromagnet 14B is disposed to surround the micro-mirror device, for driving the first driving frames 7A. However, it is possible to dispose a planer electromagnet on the first driving frame 7A, and to dispose a pair of permanent magnet at positions over and under the planer electromagnet.

In the aforementioned examples of the micro-mirror devices according to the embodiment 2, a driving system using electrostatic force generated by driving electrodes 12 or a driving system using magnetic force generated by a pair of magnets comprised of an permanent magnet and an electromagnet, is used. However, it is possible to combine these driving systems.

Furthermore, the scanning angle of the mirror forming substrate can be sensed using a piezoelectric element (not shown) disposed on the first driving frame at a position near to the base portion of the first driving frame 7A, which detects the change of the electric resistivity caused by the deformation of the first driving frame 7A.

As explained, in a micro-mirror device according to the embodiment 2, one side of the first driving frame (7A) is supported by an anchor portion (9A) projecting from the supporting substrate (6), and the first driving frame 7A comprises a driving force generating means, for example, driving electrodes 12, piezoelectric element 14, or a coupling of an permanent magnet and an electromagemet. A large displacement of the mirror forming substrate 2 in the direction A in FIG. 2 can be obtained, corresponding to a small displacement of the first driving frame 7. And, a large maximum scanning angle θsmax can be obtained. As a result, the necessary voltage for driving the mirror forming substrate can be lowered.

By the way, also in the micro-mirror device according to the embodiment 2, a groove 15 can be disposed on the supporting substrate 6 at a region under the mirror forming substrate 2, for avoiding the collision of a mirror forming substrate to the supporting substrate 6. Disposing the groove, the distance of the gap between the first driving frame 7A and driving electrodes 12 can be decreased. And as a result, the driving voltage can be lowered.

Embodiment 3

In the micro-mirror device according to the embodiments 1 and 2 of the present invention, the light beam is scanned in one dimension. On the other hand, in the micro-mirror device according to the embodiment 3 of the present invention, the light beam is scanned two dimensionally.

The micro-mirror device according to the embodiment 3 is explained below, referring to FIGS. 10 and 11.

A first driving frame 7B is connected with a mirror forming substrate 2 through a first link beam 10. A second driving frame 7C is connected with the first driving frame 7B through a third link beam 18. The first driving frame 7B has a pair of third torsion beam 16, parallel to the direction Y in FIG. 10, at the center of two sides of the first driving frame 7B. The third torsion beams 16 are perpendicular to the direction of the first link beams 10. The first driving frame 7B is supported by the pair of the third torsion beams 16, and the third torsion beams, in turn, are fixed to the supporting substrate 6 through a pair of third anchor portions 9B. Each of the third anchor portion 9B and the third torsion beam 16 form a cantilever structure.

The second driving frames 7C are fixed to the supporting substrate 6 through a pair of fourth anchor portions 9C. Each of the fourth anchor portions 9C and the second driving frame 7C form a cantilever structure in the same manner as the first driving frames.

Two pairs of piezoelectric elements 14 as driving force generating means are disposed on each of the driving frames 7B, 7C. A pair of third torsion beams 16 (second driving frame side torsion beam) are disposed, in parallel to the direction Y in FIG. 10, at the center of opposing sides of the first driving frame 7B. And two pairs of second link beam 18 (inter driving frame link beam) are disposed at a region very near to the third torsion beam 16.

A pair of sensor electrodes 19 are disposed on the supporting substrate 6 at a region under the first driving frame 7B. The scanning angles θs of the light beam around the two scanning axis (torsion beam 3, 16) are detected, using the sensor electrodes 19 and the sensor electrodes 11 disposed on the supporting substrate 6 at a region under the mirror forming substrate 2. Components in FIG. 10 identical to that in FIGS. 1 to 9 are referred by the same reference numeral, and their explanations are omitted.

The function of the micro-mirror device according to the embodiment 3 is explained below.

By imposing an alternating voltage between the upper surface and the under surface of each of the piezoelectric elements disposed on the first and second driving frames 7B, 7C, in the same manner as in the embodiment 2, oscillations are generated on each of the piezoelectric elements 14, which drive the first and second driving frames 7B, 7C.

Figure 10:
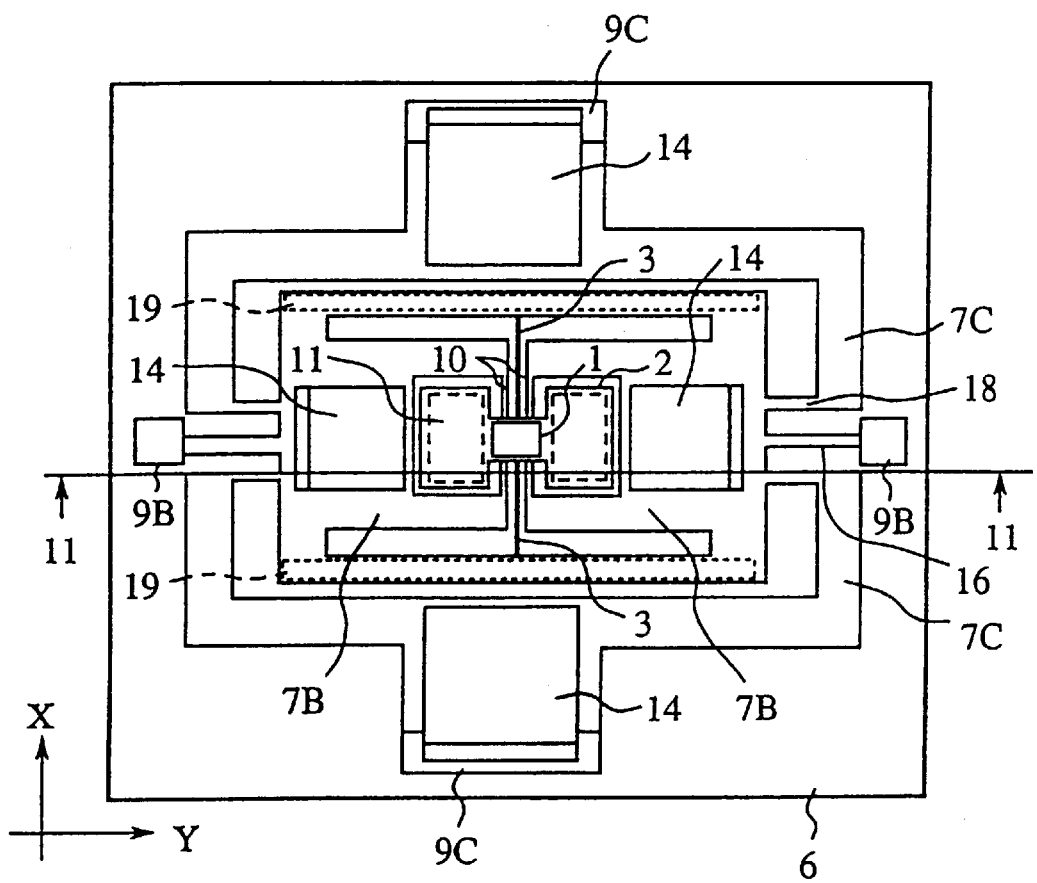
FIG. 10 is a schematic plan view of a micro-mirror device, according to Embodiment 3 of the present invention.
Figure 11:
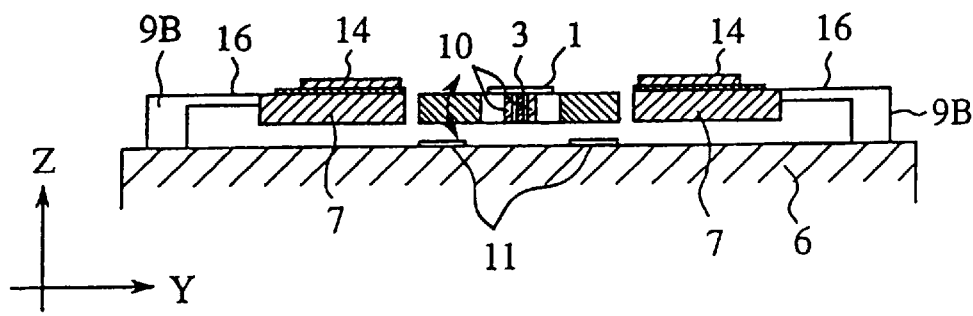
FIG. 11 is a cross sectional view of the micro-mirror device of FIG. 10, shown along the line 11—11.

Scanning around the axis Y in FIG. 10 (along the longitudinal direction of the torsion beam 16): The cantilever oscillation of the piezoelectric elements 14 are transmitted directly to the second driving frames 7C, and cantilever oscillations of the second driving frames 7C arise. The cantilever oscillations of the second driving frames 7C are transmitted indirectly to the first driving frames 7B through the third link beams 18. As a result, a torsional oscillation of the first driving frame 7B around the third torsion beam 16 occurs, when two portions of the first driving frame 7B move oppositely in the direction Z in FIG. 11. Because the first driving frame 7B is connected to the mirror forming substrate 2 through the first link beam 10, the mirror forming substrate 2 oscillates following the torsional oscillation of the driving frame 7B.

Scanning around the axis X in FIG. 10 (along the longitudinal direction of the torsion beam 3): As explained, the oscillation of the piezoelectric elements 14 are transmitted directly to the first driving frames 7B, which cause cantilever oscillations of the first driving frames 7B. The driving forces due to this cantilever oscillation is transmitted indirectly to the mirror forming substrate 2 through the link beams 10. As a result, a torsional oscillation of the mirror forming substrate 2 around the torsion beam 3 is induced.

The scanning angles around two axes can be monitored as follows. The scanning angle θs around the first torsion beam 3 is monitored by the sensor electrodes 11 disposed on the supporting substrate 6 at a region under the mirror forming substrate 2. The sensor electrodes 11 detect the electrostatic capacity between the mirror forming substrate 2 and the sensor electrodes 11. And the scanning angle θs around the third torsion beams 16 is monitored by the sensor electrodes 19 disposed on the supporting substrate 6 at a region under the second driving frames 7C. The sensor electrodes 19 detect the electrostatic capacity between the second driving frames 7C and the sensor electrodes.

Alternately, the scanning angles can be monitored, using piezoresistors disposed near to their anchor portions. The electric resistivity of a piezoresistor changes according to its deformation, for example, due to the oscillation of the driving frames. Therefore, the scanning angle of the mirror forming substrate 2 can be monitored by detecting the displacement of the driving frames, on the basis of the change of the electric resistivity.

In the aforementioned micro-mirror device according to the embodiment 3, the first and second driving frames 7B, 7C are driven by piezoelectric elements 14, however, the driving force generating means are not limited to piezoelectric elements 14. The driving force can be obtained from, for example, an attractive electrostatic force between a pair of driving electrodes, an attractive force between a pair of magnets, or a combination of them, which have been explained in detail.

As explained, the micro-mirror device according to the embodiment 3 further comprises: a second driving frame 7C; the ends of the first torsion beams 3 are supported by the first driving frame 7B; the first driving frame 7B has third torsion beams 16, disposed on one side of the first driving frame 7B opposing to the first link beam 10, perpendicular to the first torsion beam 3; the ends of the third torsion beams 16 are supported by a pair of third anchor portions 9B projecting from the supporting substrate 6; the second driving frame 7C is connected to the first driving frame 7B through a second link beam 18, which is disposed at one side of the second driving frame 7C in parallel to the longitudinal direction of the third torsion beams 16. And each of the first and second driving frames 7B, 7C comprise a driving force generating means, for example, driving electrodes 12, piezoelectric element 14, or a coupling of an permanent magnet and an electromagnet.

A large displacement of the mirror forming substrate 2 in the directions XY in FIG. 2 can be obtained, corresponding to the small displacement of the first and second driving frame 7B, 7C. The maximum scanning angles θsmax around two axes is large. And, two dimensional scanning of a light beam using a mirror forming substrate is possible, using a low driving voltage.

Also in the micro-mirror device according to embodiment 3, a pair of grooves 15 can be disposed on the supporting substrate 6 at a region under the mirror forming substrate 2 for avoiding the collision of the mirror forming substrate 2 to the supporting substrate 6, when a pair of driving electrodes are used as a driving force generating means, in the same manner as in the embodiment 1. When such grooves are disposed, the distance between the supporting substrate 6 and each of the driving frames 7B, 7C can be decreased, and the necessary driving voltage can be lowered.

In the micro-mirror device according to the embodiment 3 explained hereinbefore, two first driving frames 7B are disposed at both right and left portions of the mirror forming substrate 2, and two second driving frames 7C are disposed at both right and left sides of the first driving frames 7B, however, it is possible to dispose only one first driving frame 7B at one side of the mirror forming substrate 2 or only one second driving frame 7C at one side of the first driving frame 7B so that a cantilever oscillation occurs on each of them.

In the micro-mirror device according to the embodiment 3 explained hereinbefore, the first link beams 10 are disposed very near to the torsion beam 3, and the second link beams 18 are disposed very near to the torsion beam 16, however the connecting positions between the mirror forming substrate and the driving frames 7B and between the driving frames 7B and the driving frames 7C are not limited to such positions. The link beams 10, 18 can be positioned at a region a little far from the link beams 3, 16. When the size of the driving frames 7B are larger compared to the mirror forming substrate 2, and the distance between the torsion beam 8 and the conjunction point of the link beam 10 to the mirror forming substrate 2 is relatively large, a small displacement of the driving frames 7B in the direction Z in FIG. 11 can cause a large scanning angle of the mirror forming substrate 2.

Embodiment 4

The micro-mirror device according to the embodiment 4 of the present invention is explained below, referring to FIGS. 12, 13.

A mirror 1 is formed on a mirror forming substrate 2A, which is connected with a first driving frame 7D through a first torsion beam 3. The mirror forming substrate 2A is not symmetrical with respect to the first torsion bean 3. In the example shown in FIGS. 12, 13, the mirror forming substrate 2A has a planer structure, in which the driving frame side half area (left portion) of the mirror forming substrate 2 is larger compared to the rest half (right portion). The first driving frame 7D can be driven, for example, by an electrostatic force caused by driving electrodes 12, or by an oscillation of piezoelectric elements 14. The driving electrodes 12 and the piezoelectric elements 14 are commonly shown in FIGS. 12, 13. The other components in FIGS. 12. 13 identical to that in FIG. 1 to 9 are referred by the same reference numerals, and their explanations are omitted.

For the purpose of the explanation, it is assumed that the first driving frame 7D are driven by driving electrodes 12. A direct voltage Vdc and an alternating voltages Vac, which are explained in the embodiment 1, are applied between the first driving frame 7D and the driving electrode 12 disposed on the supporting substrate 6 at a region under the first driving frames 7D. Then a cantilever oscillation of the first driving frame 7D around an anchor portion 9A occurs in the direction Z. The driving force of the first driving frame 7D is transmitted to the mirror forming frame 2 through the first torsion beam 3. The transmitted force acts as an inertia force to the mirror forming substrate 2. Because the mirror forming substrate has a planer structure, which is not symmetrical with respect to the torsion beam 3, and its center of the weight is not on the torsion beam 3, a torsional torque around the torsion beam 3 is generated by the inertia force from the first driving frame 7D. As a result, an oscillation of the mirror forming substrate 2 around the torsion beam 3 occurs.

Figure 12:
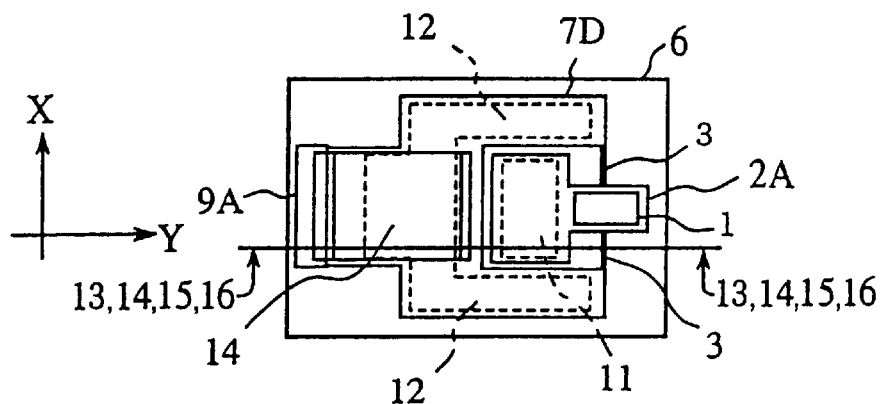
FIG. 12 is a schematic plan view of a micro-mirror device, according to Embodiment 4 of the present invention.
Figure 13:
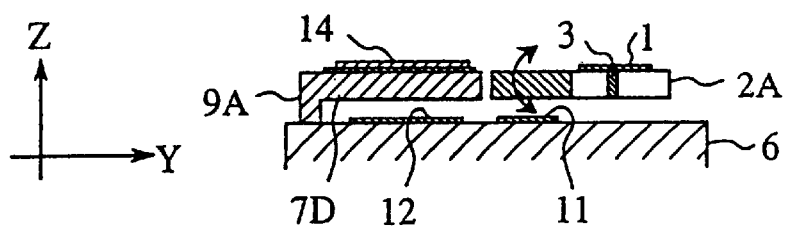
FIG. 13 is a cross sectional view of the micro-mirror device of FIG. 12, shown along the line 13—13.

Piezoelectric elements as a driving force generating means are shown in FIGS. 12, 13, however, their explanation is omitted, because they are explained in the other embodiments. The driving force generating means are not limited to such an amendment. For example, a pair of magnets, which has been explained in the embodiment 2, or combinations of these driving force generating means can be employed as a driving force generating means.

Figure 14:
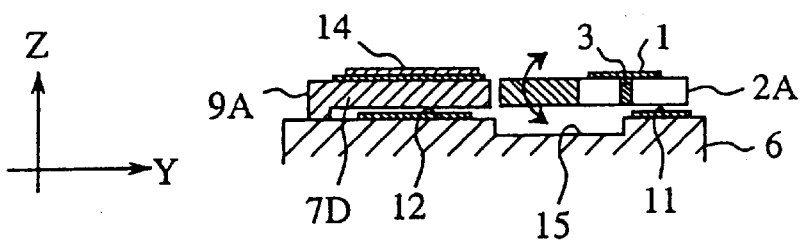
FIG. 14 is a schematic plan view of a micro-mirror device, according to Embodiment 4 of the present invention, using another driving force generating means, shown along the same line 14—14 in FIG. 12.

Another example of the micro-mirror device according to the embodiment 4 is explained below, referring to FIG. 14.

A groove 15 is disposed on the supporting substrate 6 at a region under the mirror forming substrate 2A for preventing the collision of the mirror forming substrate 2 to the supporting substrate 6. When this structure is employed, the distance between the first driving frame 7D and the driving electrodes 12 can be decreased. Therefore, the necessary driving voltage for driving the first driving frame 7D, by an attracting electrostatic force between a pair of driving electrodes as a driving force generating means, can be lowered.

Further another example of the micro-mirror device according to the embodiment 4 is explained below, referring to FIG. 15.

The mirror forming substrate 2B is thin so that the distance between the mirror forming substrate 2B and the supporting substrate 6 can be sufficiently large. In the example shown in FIG. 15, the mirror forming substrate 2B is aligned with the upper surface of the first driving frame 7D so that the distance between the mirror forming substrate 2B and the supporting substrate 6 can be as large as possible. When this structure is employed, it is not necessary to make a groove 15 such as shown in FIG. 14, therefore the structure of the micro-mirror device can be simplified, and simultaneously the distance between the first driving frame 7D and the driving electrodes 12 can be decreased. Therefore, the necessary driving voltage for driving the driving frame 7D, by an attracting electrostatic force between a pair of driving electrodes 12 and the driving frames, can be lowered.

Also in this embodiment, the scanning angle of the mirror can be monitored by a piezoresistor disposed on the first driving frame 7D at a region near to the anchor portion, on the basis of the change of electric resistivity of a piezoresistor caused by the displacement of the first driving frame 7D.

As explained, the micro-mirror device according to the embodiment 4 comprises: a mirror forming substrate 2A, 2B, on which a mirror portion 1 is formed; a first torsion beam 3 disposed on a pair of opposing sides of the mirror forming substrate 2A, 2B; a first driving frame 7D, disposed at the outer portion of the mirror forming substrate 2A, 2B and supporting the first torsion beam 3; and a driving force generating means for giving a driving force to the first driving frame 2A, 2B. The driving force generating means comprises, for example, driving electrode 12, piezoelectric element 14, and a pair of magnets composed of an permanent magnet and an electromagnet. The micro-mirror device according to the embodiment 4 has a simple structure compared to that of the embodiments 1 and 2, however, it has similar advantages as that of the embodiments 1 and 2.

Embodiment 5

The embodiment 5 of the present invention relates to a method for producing a micro-mirror device according to the present invention.

Figure 15:
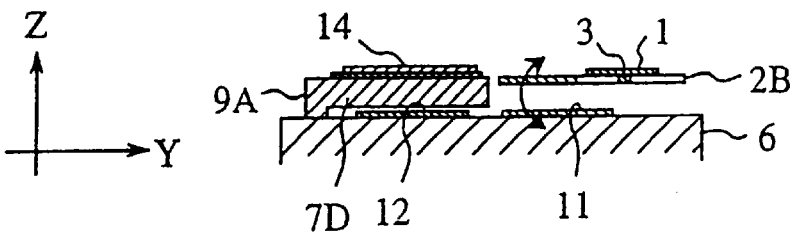
FIG. 15 is a schematic plan view of a micro-mirror device, according to Embodiment 4 of the present invention, using another driving force generating means, shown along the same line 15—15 in FIG. 12.

The method for producing a micro-mirror device having the structure shown in FIG. 15 is explained here, as an example of the method for producing a micro-mirror devices according to the embodiments 1 to 4. However, the method is basically applicable to the micro-mirror devices according to the other embodiments.

The method is explained, referring to FIGS. 16(a)–16(f).

Etching patterns for forming a mirror forming substrate 2B and a first torsion beam 3 are formed on a first layer etching mask 23, which is made from a resist layer in this example. An etching pattern for forming a driving frame 7D is formed on a second etching mask 24. The second etching mask 24 is made from a thin metal layer such as a thin aluminum layer which can resist when the resist layer as an etching mask 23 of the first etching layer 23 is removed. A pattern for forming a pair of anchor portions 9A of the driving frame 7D is formed on a third etching mask 25. The third etching mask 25 is made from an oxidized layer which can resist when the thin metal layer as an etching mask 24 of the second etching layer 24 is removed.

The structured body of a micro-mirror device is formed from a device wafer 26. For example, a silicon single crystal substrate having (100) surface is used, because it is cheaply available as a material substrate. Reference numeral 27 denotes a handle wafer, which will be removed when the production process is completed. The device wafer 26 and the handle wafer 27 are jointed through a oxidized layer 25' to constitute a material substrate 28, so-called SOI (Silicon On Insulator) substrate.

Figure 16A:
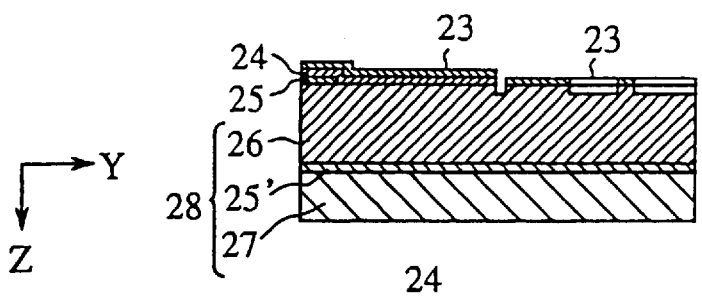
FIGS. 16(a)–16(f) shows processes for producing the micro-mirror device having the structure shown in FIG. 15. Each of the figures is a cross sectional view of FIG. 12 along the line 16—16.
Figure 16B:
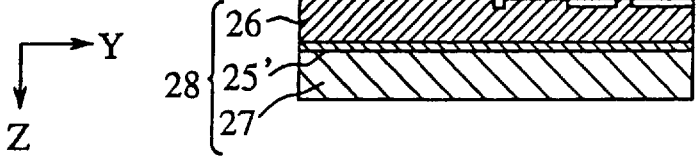
Figure 16C:
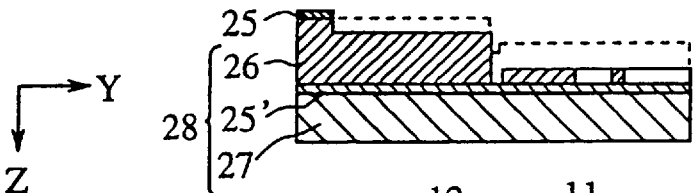
Figure 16D:
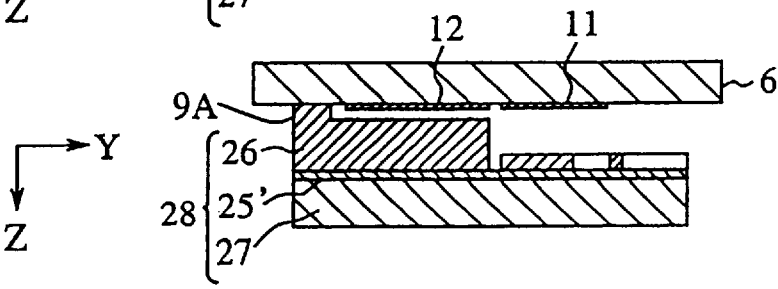

A micro-mirror device according to the present invention is fabricated as follows: At first, the first, second and third etching masks 23, 24, 25 are formed in sequence on the SOI substrate at its device wafer side 26, applying conventional etching mask forming processes and patterning processes, for example, photo-lithography process, sputtering process, etching process, etc. In making a multi-layer mask, the material of an inner layer etching mask shall be selected from a material that can resist when the outer layer, which is near to the outer surface, is removed. The structure of the multi-layer etching mask shall be designed so that a structured body, which contains vertical portions extending in the direction Z, such as the pair of anchor portions 9A in FIG. 16(d), is formed, by not being removed by the etching processes.

After making the etching masks 23, 24, 25 on the SOI substrate, a highly anisotropic etching of the SOI substrate 28 is performed from the outer side etching mask 23. In the highly anisotropic etching, the SOI substrate 28 is etched in the direction perpendicular to the surface (direction Z in FIGS. 16(a)–16(f). Such a highly anisotropic etching can be carried out using a commercially available silicon dry etching apparatus (for example, ICP-RIE apparatus). In highly anisotropic etching, the side wall of the SOI substrate is not etched, therefore, a structured body with small undercutting etching in the direction Y in FIG. 16(b) can be obtained.

FIGS. 16(a)–16(f) is a cross sectional view of a SOI substrate after highly anisotropic etching of the outer side etching mask 23. After the highly anisotropic etching, the resist layer as a first etching mask 23 is removed, applying so-called $O_2$ ashing process. After this process, the thin metal layer as a second etching mask 24 appears on the surface. Another highly anisotropic etching is carried out to this second etching mask 24 in the same manner as in the etching of the first etching mask 23. When the second etching is completed, the structure formed by the first etching is maintained, and a structure with a homogeneous etching depth in the vertical direction (the direction Z in FIG. 16) is obtained.

When the second etching mask 24 is removed, the third etching mask 25 made from oxidized layer appears on the surface. In the third etching, the surface portion of the SOI substrate 28 is removed over about 5 micro-meter depth from the original surf ace. As a result, the structured body shown in FIG. 16(c) is formed. Then the SOI substrate, on which the structured body is formed, is treated by hydrofluoric acid to remove the etching mask 25.

Figure 16E:
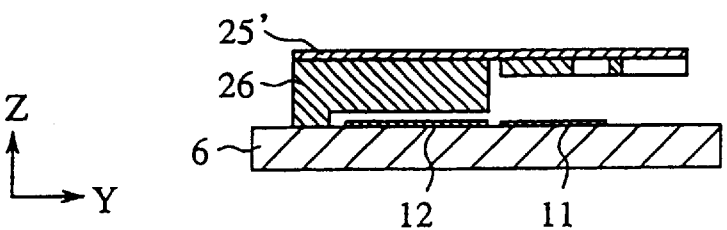
Figure 16F:
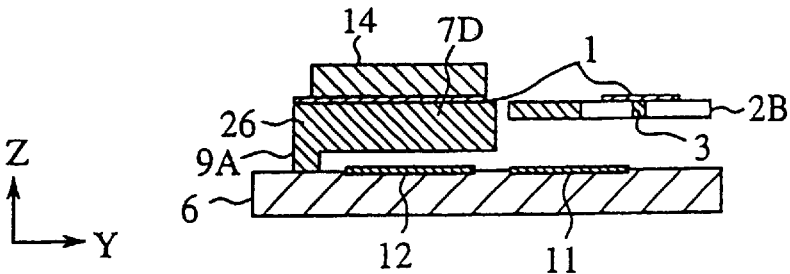
Figure 17:
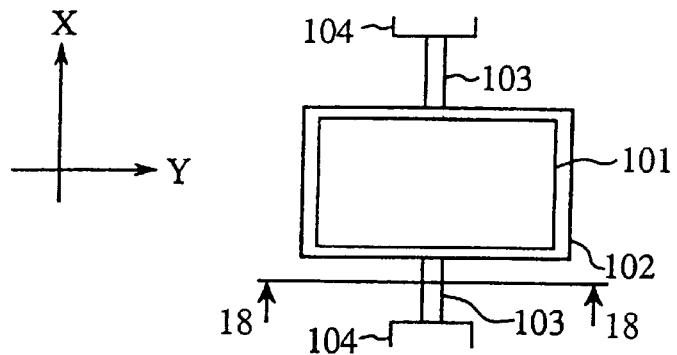
FIG. 17 is a schematic plan view of the micro-mirror device in the prior art.
Figure 18:
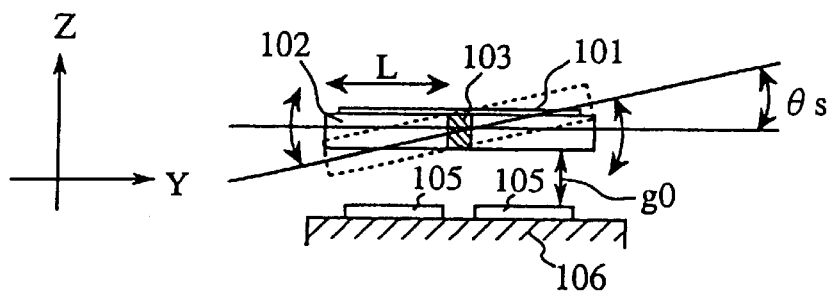
FIG. 18 is a cross sectional view of the micro-mirror device of FIG. 17, shown along the line 18—18.

In the next step, applying a conventional anode junction method, the anchor portions 28 of the SOI substrate 28, on which the structured body is formed, is connected with a supporting substrate 6 made from, for example, pyrex glass, on which metal electrodes (driving electrodes 12 and sensor electrodes 11) are disposed, so that a structure shown in FIG. 16(d) is obtained. Then, the handle wafer 27 of this structured body is removed by wet etching process or by dry etching process, as shown in FIG. 16(e).

The rest oxidized layer 25' can be removed by hydrofluoric acid treatment. After this process, thin metal layers, such as aluminum or chromium/gold layer, are formed on the mirror forming substrate 2B and on the driving frame 7D, for making for example, a mirror portion 1, applying a so-called selective sputtering method or selective evaporation method. Finally a micro-mirror device is accomplished, by forming a pair of piezoelectric elements 14, as driving means, on the first driving frames 7D (FIG. 16(f)).

As explained, according to the method for production of a micro-mirror device of the present invention, a t first, etching masks 23, 24, 25, on which patterns corresponding to the components of a micro-mirror device are formed, are formed on an SOI sub substrate 28 to form a multi-layer; then an anisotropic etching process and an etching mask removing process are carried out alternatively to the SOI substrate 28 from the outer etching mask 23 so as to form the components of a micro-mirror device to obtain a micro-mirror device. According to this method, the etching masks can be previously formed on a flat smooth plane, therefore, a precise patterning of a etching mask is possible.

In the example of the method for producing a micro-mirror device explained hereinbefore, etching on the SOI substrate is performed only from the upper side surface of the SOI substrate. However, the substrate is not limited to an SOI substrate. Etching masks can be multi-layer etching masks disposed on both sides of a material substrate so that the etching process can be performed from both sides of the material substrate. In this case, the patterning of the etching masks can be carried out from both sides of the material substrate, and a precise alignment is possible.

In the example of the method for producing a micro-mirror device explained hereinbefore, three etching masks are used, however, it is possible to use four or more masks, depending upon the structure of the micro-mirror device.

What is claimed is:

1. A micro-mirror device comprising:
   a supporting substrate;
   a mirror forming substrate, on which a mirror is located;
   a pair of first torsion beams disposed on opposing sides of the mirror forming substrate, perpendicular to those sides and supporting the mirror forming substrate;
   a first driving frame surrounding at least one side of the mirror forming substrate and connected to the mirror forming substrate through a first link beam, parallel to the first torsion beams; and
   first driving force generating means for driving the first driving frame to move so that movement is transmitted to the mirror forming substrate through the first link beam.

2. The micro-mirror device according to claim 1, wherein the first torsion beams are supported at respective ends by a pair of first anchors projecting from the supporting substrate.

3. The micro-mirror device according to claim 1, wherein ends of the first torsion beam are supported by the first driving frame.

4. The micro-mirror device according to claim 1, further comprising:
   a second driving frame;
   second driving force generating means for driving the second driving frame to move, wherein
   ends of the first torsion beams are supported by the first driving frame;
   the first driving frame has third torsion beams, disposed on one side of the first driving frame opposing the first link beam, and perpendicular to the first torsion beam;
   ends of the third torsion beams are supported by a pair of third anchors projecting from the supporting substrate; and
   the second driving frame is connected to the first driving frame through a second link beam, disposed on a first side of the second driving frame, parallel to the third torsion beams.

5. The micro-mirror device according to claim 4, wherein the first side of the second driving frame is supported by a fourth anchor projecting from the supporting substrate.

6. The micro-mirror device according to claim 4, wherein the second link beam is connected to the first driving frame proximate a base of the third torsion beams.

7. The micro-mirror device according to claim 4, wherein the second driving force generating means comprises a driving electrode disposed on the supporting substrate under the second driving frame, a driving voltage applied either to the first driving frame or to the driving electrode driving the driving frame through an attracting electrostatic force between the second driving frame and the driving electrode.

8. The micro-mirror device according to claim 4, wherein the second driving force generating means comprises a piezoelectric element disposed on the second driving frame, an alternating voltage applied between upper and under surfaces of the piezoelectric element causing a bending oscillation of the piezoelectric element.

9. The micro-mirror device according to claim 4, wherein the second driving force generating means comprises a coupled permanent magnet and electromagnet, the second driving frame being driven by a magnetic force coupling the permanent magnet and the electromagnet.

10. The micro-mirror device according to claim 1, wherein
the first driving frame has a pair of second torsion beams disposed on a pair of opposing sides of the first driving frame, the second torsion beam being parallel to the first torsion beam; and
ends of the second torsion beam are supported by a pair of second anchors projecting from the supporting substrate.

11. The micro-mirror device according to claim 1, wherein one side of the first driving frame is supported by an anchor projecting from the supporting substrate.

12. The micro-mirror device according to claim 1, wherein the first link beam is connected to the mirror forming substrate proximate a base of the first torsion beams.

13. The micro-mirror device according to claim 1, wherein the first driving force generating means comprises a driving electrode disposed on the supporting substrate under the first driving frame, a driving voltage applied either to the first driving frame or to the driving electrode driving the driving frame through an attracting electrostatic force between the first driving frame and the driving electrode.

14. The micro-mirror device according to claim 1, wherein the first driving force generating means comprises a piezoelectric element disposed on the first driving frame, an alternating voltage applied between upper and under surfaces of the piezoelectric element causing a bending oscillation of the piezoelectric element.

15. The micro-mirror device according to claim 1, wherein the first driving force generating means comprises a coupled permanent magnet and electromagnet, the first driving frame being driven by a magnetic force coupling the permanent magnet and the electromagnet.

16. The micro-mirror device according to claim 1, wherein the supporting substrate includes a recess at a region under the mirror forming substrate.

* * * * *